US006693507B1

(12) United States Patent
Haugaard et al.

(10) Patent No.: US 6,693,507 B1
(45) Date of Patent: Feb. 17, 2004

(54) THERMAL PROTECTOR MOUNTING BRACKET AND IMPROVED THERMALLY-PROTECTED BALLAST

(75) Inventors: Eric J. Haugaard, Kenosha, WI (US); Wayne P. Guillien, Franksville, WI (US); Theodore O. Sokoly, Franklin, WI (US)

(73) Assignee: Ruud Lighting, Inc., Racine, WI (US)

( * ) Notice: Subject to any disclaimer, the term of this patent is extended or adjusted under 35 U.S.C. 154(b) by 0 days.

(21) Appl. No.: 10/214,226

(22) Filed: Aug. 7, 2002

(51) Int. Cl.[7] .................................................. H05K 5/00
(52) U.S. Cl. ........................ 337/205; 337/380; 361/427
(58) Field of Search ................................ 361/427–430, 361/417–420; 337/186, 187, 205–208, 4, 194, 214, 365, 380; 315/56–60

(56) References Cited

U.S. PATENT DOCUMENTS

| | | | | |
|---|---|---|---|---|
| 4,061,935 A | | 12/1977 | Kandpal | 310/68 C |
| 4,297,668 A | | 10/1981 | Place | 337/365 |
| 4,335,270 A | | 6/1982 | Holce et al. | 174/52 R |
| 4,420,802 A | | 12/1983 | Smester et al. | 362/364 |
| 4,446,451 A | | 5/1984 | Boulanger | 337/380 |
| 4,604,673 A | | 8/1986 | Schoendube | 361/38 |
| 4,847,733 A | * | 7/1989 | Roy et al. | 361/427 |
| 4,861,943 A | | 8/1989 | Yarmark | 174/52.1 |
| 4,887,063 A | | 12/1989 | Hafsass | 337/380 |
| 5,126,510 A | | 6/1992 | Bauer et al. | 174/52.1 |
| D365,804 S | | 1/1996 | Klaus | D13/178 |
| 5,615,071 A | | 3/1997 | Higashikata et al. | 361/22 |
| 5,662,496 A | * | 9/1997 | Kanamori | 337/186 |
| 5,925,280 A | * | 7/1999 | Lee | 337/205 |
| 5,926,659 A | | 7/1999 | Matsui | 396/206 |
| 6,587,028 B2 | * | 7/2003 | Mollet et al. | 337/194 |

* cited by examiner

*Primary Examiner*—Wilson Lee
(74) *Attorney, Agent, or Firm*—Jansson, Shupe & Munger, Ltd.

(57) ABSTRACT

A unitary bracket particularly suited for mounting a thermal protector to a ballast for an electrical lighting fixture. The unitary bracket has a holding-face portion with opposite edges and a mounting end, edge portions on the opposite edges angled toward the electrical device, and a mounting-end portion on the mounting end and extending toward the electrical device, the mounting-end portion having a mounting tab for engagement with the electrical device, the portions being configured and dimensioned to sandwich the thermal protector against the electrical device when the mounting-end portion is secured thereto. An improved thermally-protected ballast includes the bracket.

31 Claims, 4 Drawing Sheets

THERMAL PROTECTOR MOUNTING BRACKET AND IMPROVED THERMALLY-PROTECTED BALLAST

FIELD OF THE INVENTION

This invention relates generally to ballasts with thermal protection, and more specifically to thermal protector mounting devices.

BACKGROUND OF THE INVENTION

Electrical lighting fixtures often involve the use of ballasts, and it is known practice to provide protection from overheating by including thermal protectors in the circuitry in order to break the flow of current to the ballasts when the thermal protector reaches a predetermined temperature. The prior art includes a variety of mounting devices for securing thermal protectors in relationship with ballasts and other electrical devices.

Among the factors which contribute to the performance and cost of providing thermal protection are the following: (1) how well and how reliably the thermal protector is held in contact with the device being protected; (2) the heat transfer from the ballast to the thermal protector itself; (3) the cost of material and fabrication of the mounting means; and (4) the cost of assembly and installation. There is a need for very low cost and easily usable devices to hold thermal protectors in place and to ensure that good thermal contact is established and held between thermal protectors and the devices being protected, particularly ballasts such as those used in lighting fixtures.

Typically, a ballast has two leads for the secondary (output) side of the ballast but provides more than two leads as connections to the primary (input) coils, allowing a manufacturer to use common parts for a variety of end usage voltages (e.g., 120V, 208V, 240V, 277V and 480V) or allowing an installer the flexibility to use the same ballast for a variety of different input voltages. However, providing such flexibility translates into higher assembly or installation costs for the electrical lighting manufacturer or installer, and, in both cases, creates opportunities for assembly or installation errors.

Some of the prior art involving securing thermal protectors with respect to electrical devices such as ballasts include the following United States patents: U.S. Pat. No. 4,861,943 (Yarmark); U.S. Pat. No. 5,126,510 (Bauer et al.); U.S. Pat. No. 5,463,522 (van Wagener et al.); U.S. Pat No. 4,924,350 (Reddy et al.); and U.S. Pat. No. 5,926,659 (Matsui). These prior disclosures fall short of offering and delivering simple, effective devices for mounting thermal protectors to electrical devices such as ballasts for lighting fixtures.

There is a need for an improved thermal protector mounting device which combines a number of advantages and features including: holding the thermal protector directly against the surface of the ballast; doing so with a simple, one-piece structure which easily and reliably places the thermal protector in predictable heat transfer relationship with the electrical device such as a ballast; and providing simplicity of assembly, installation and thermal protector replacement when needed, all at minimum cost.

OBJECTS OF THE INVENTION

Accordingly, it is a principal object of this invention to provide a low-cost bracket to mount thermal protectors to electrical devices such as ballasts for lighting fixtures.

Another object of this invention is to provide a mounting bracket which enables a thermal protector to be in direct contact with the ballast or other electrical device being protected.

Yet another object of this invention is to provide an improved ballast with thermal protection that is assembled with its thermal protector in a manufacturing plant, independent of which primary leads of the ballast are required by the input voltage of the particular lighting applications—rather than being wired in during installation into a particular lighting fixture.

Another object of the invention is to provide a bracket for mounting a thermal protector which prevents the thermal protector from being dislodged easily from the mounting bracket.

Another object of the invention is to provide a bracket for mounting a thermal protector which enables the thermal protector to be replaced easily.

Yet another object of this invention is to minimize the cost of assembly and installation of thermal protectors into electrical systems such as lighting fixtures.

Another object of the invention is to provide a bracket for mounting a thermal protector which prevents damage to the wires of the thermal protector.

These and other objects of the invention will be apparent from the following descriptions and from the drawings.

SUMMARY OF THE INVENTION

The present invention is an improved mounting bracket for thermal protectors for use on electrical devices such as ballasts which overcomes the above-noted problems and shortcomings and satisfies the objects of the invention. The invention also involves improved thermally-protected ballasts including such brackets.

In describing the invention, certain terminology is used which is defined as follows: The term "unitary" as used herein refers to the fact that the mounting bracket is made of a single piece of material; e.g., in a highly preferred embodiment the bracket is a single piece stamped from spring steel sheet stock. The term "holding-face portion" as used herein refers to the portion of the inventive bracket through which, as hereafter described, the bracket pushes the thermal protector into reliable direct contact with the ballast or other electrical device.

The unitary bracket of this invention is used for mounting a thermal protector to an electrical device such as a ballast for lighting fixtures. The inventive bracket includes: (1) a holding-face portion having therealong opposite edges and a mounting end; (2) edge portions on the opposite edges of the holding-face portion and angled with respect thereto toward the electrical device; and (3) a mounting-end portion on the mounting end and extending toward the electrical device, the mounting-end portion having a mounting tab for engagement with the electrical device, the portions being configured and dimensioned to sandwich the thermal protector against the electrical device when the mounting-end portion is secured thereto.

In a particular embodiment of the invention, the thermal protector has a contact side for contact with a contact surface of the electrical device and a thickness dimension extending from the contact side, and the mounting-end portion is configured and dimensioned such that, with the thermal protector removed, the holding-face portion is positioned no farther from the contact surface of the electrical device than the thickness dimension of the thermal protector. In a further embodiment of the unitary bracket, with the thermal protector removed, the holding-face portion is positioned slightly closer to the contact surface of the electrical device than the thickness dimension of the thermal protector.

In some preferred embodiments of the unitary bracket, the unitary bracket is of a springy material, and in particular embodiments, the springy material is a springy metal such as spring steel.

In preferred embodiments of the inventive bracket, the edge portions and the holding-face portion of the unitary bracket together form an opening for insertion of the thermal protector and from which wires of the thermal protector extend, thereby facilitating assembly and replacement. It is preferred that the unitary bracket include a finger-tab portion on the holding-face portion at the insertion opening, the finger-tab portion extending part way toward the electrical device and having a smooth surface facing the electrical device for finger and wire contact. It is also preferred that the bracket include a retention spur projecting from the holding-face portion near the insertion opening in position to prevent unintended withdrawal of the thermal protector.

The thermal protector has a contact side for contact with a contact surface of the ballast or other electrical device and a thickness dimension extending from the contact side. One particularly preferred embodiment involves: the ballast or other electrical device having an adjacent surface which is adjacent to the contact surface; the edge portions of the unitary bracket being parallel to one another; and one of the edge portions (a wider portion) extending from the holding-face portion of the bracket to a distal edge which is farther from the holding-face portion than the thickness dimension of the thermal protector. In this preferred configuration, such wider edge portion serves an alignment function to properly position the thermal protector on the contact surface of the electrical device. More specifically, the wider edge portion engages the adjacent surface of the ballast or other electrical device, and thus facilitates the desired engagement of the contact side of the thermal protector with the contact surface of the ballast or other electrical device.

In preferred embodiments, as already noted, the electrical device with which the mounting bracket is used is a ballast for electrical lighting fixtures, the ballast being of the type having thermal protection. Each such ballast has ballast laminations and primary and secondary coils, a thermal protector and a mounting device for securing the thermal protector to the ballast.

In highly preferred embodiments, the mounting tab of the unitary bracket has a hole therethrough and is secured to the ballast with a fastener. In certain highly preferred embodiments, the ballast is of the type having its laminations held together by at least one ballast bolt therethrough and the fastener is one of the ballast bolts. In certain preferred embodiments, the thermal protector of the improved ballast is wired in series with the secondary coil of the ballast. This electrical configuration enables wiring assembly of the thermal protector with the ballast to be independent of the input voltage to the primary coil required by the particular usage of the ballast, thereby significantly simplifying assembly and installation, lowering cost and eliminating wiring errors.

DETAILED DESCRIPTION OF PREFERRED EMBODIMENTS

Figure 1:
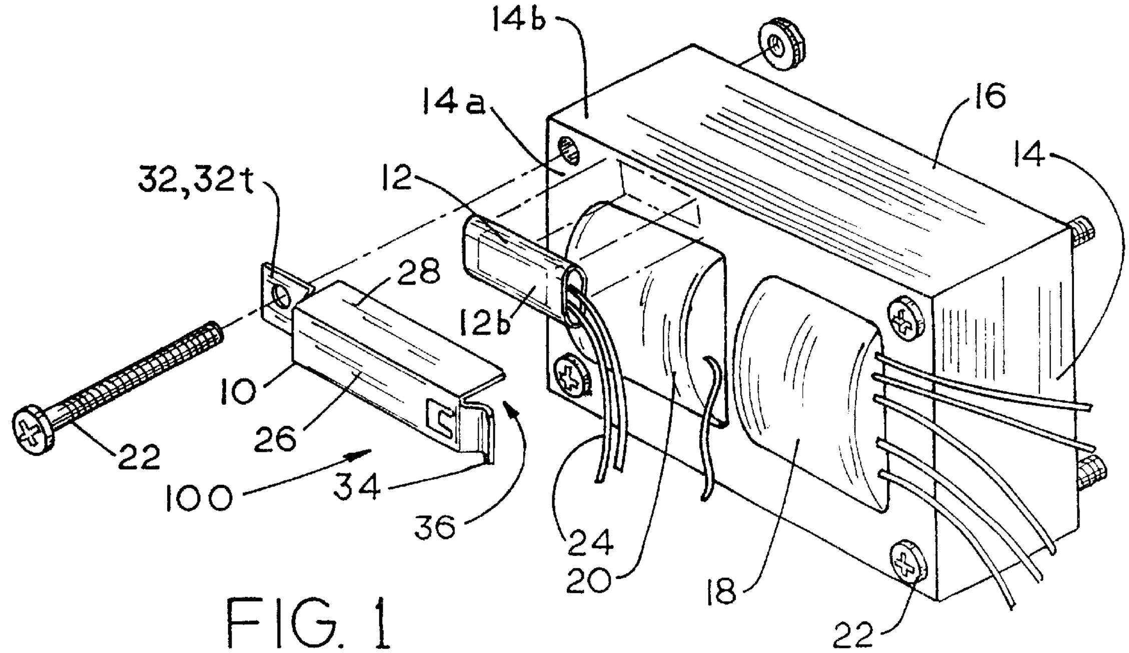
FIG. 1 is a exploded perspective view of the ballast with thermal protection in accordance with this invention.
Figure 2:
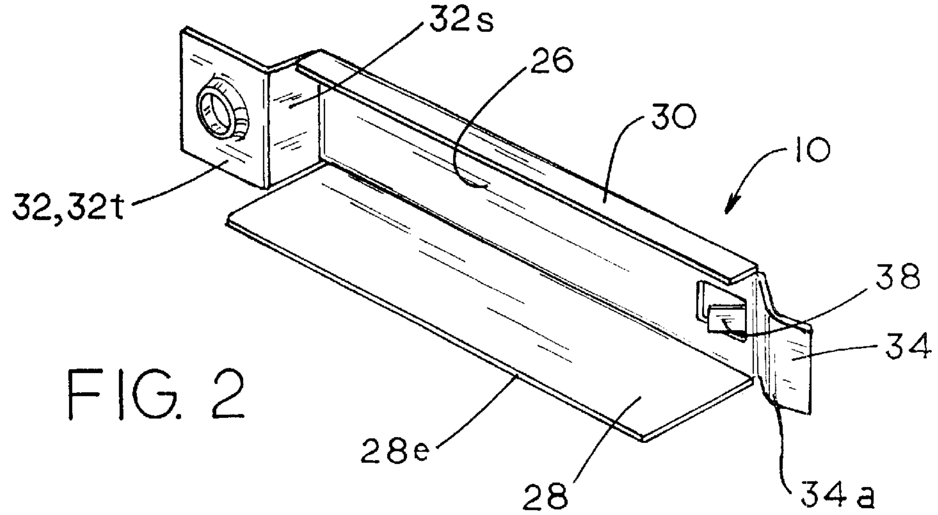
FIG. 2 is a rear inverted perspective view of the bracket of FIG. 1.
Figure 3:
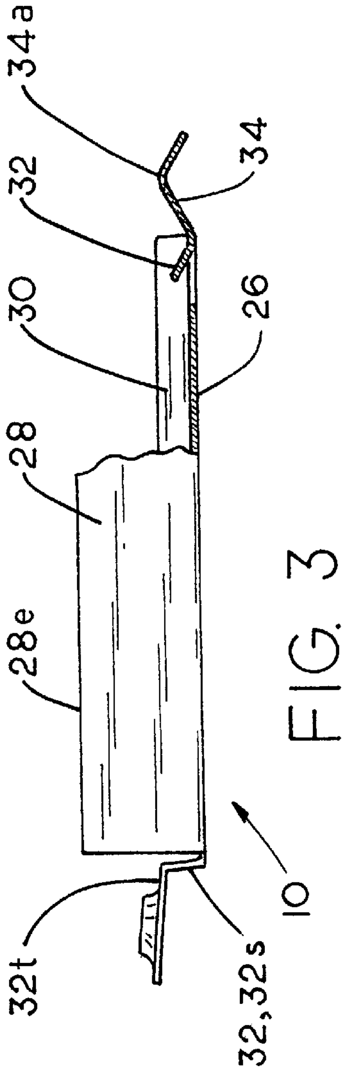
FIG. 3 is a partially broken-away top plan view of the bracket.
Figure 4:
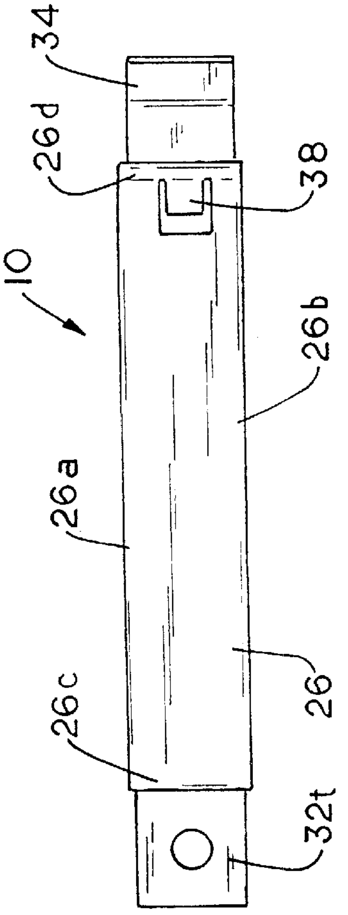
FIG. 4 is a front elevation of the bracket.
Figure 5:
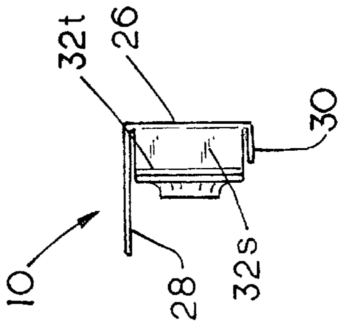
FIG. 5 is a left side elevation of the bracket.
Figure 6:
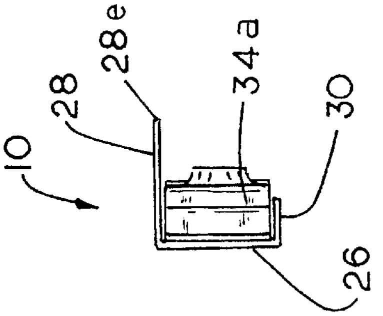
FIG. 6 is a right side elevation of the bracket.

The figures illustrate a preferred bracket 10 in accordance with this invention, serving the purpose of improved mounting of a thermal protector 12 to a ballast 14. FIG. 1 illustrates an improved ballast 100 with thermal protection in accordance with this invention, including all its parts—ballast proper 14 (hereinafter referred to simply as "ballast 14"), thermal protector 12 and bracket 10.

Figure 7:
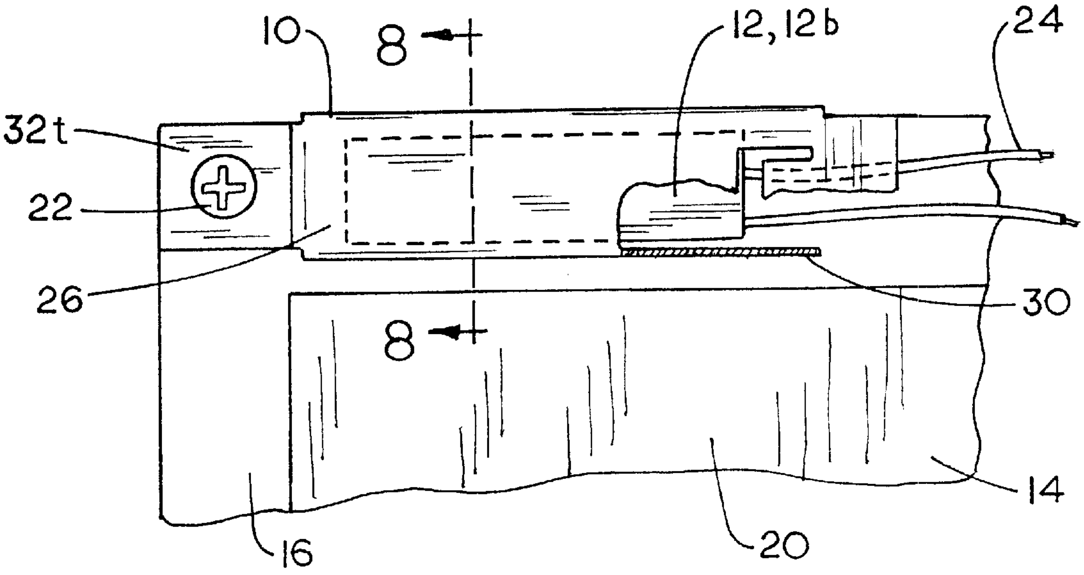
FIG. 7 is a fragmentary front elevation of the ballast with the bracket and thermal protector assembled, partially broken away to show the thermal protector.
Figure 8:
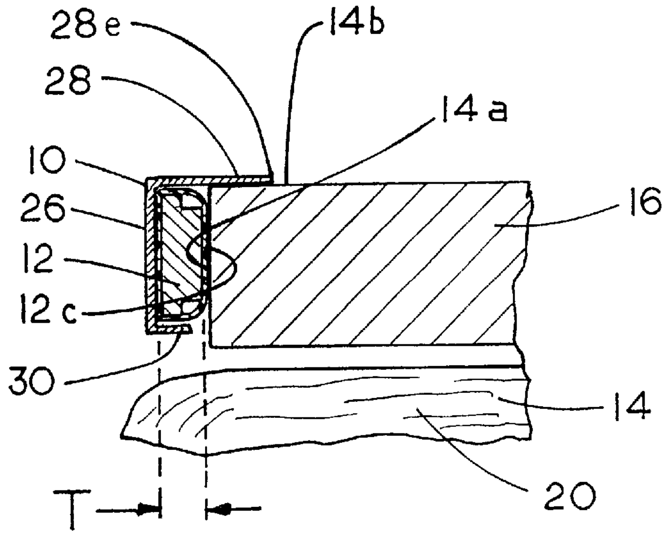
FIG. 8 is a sectional view along section 8—8 as indicated in FIG. 7.
Figure 9:
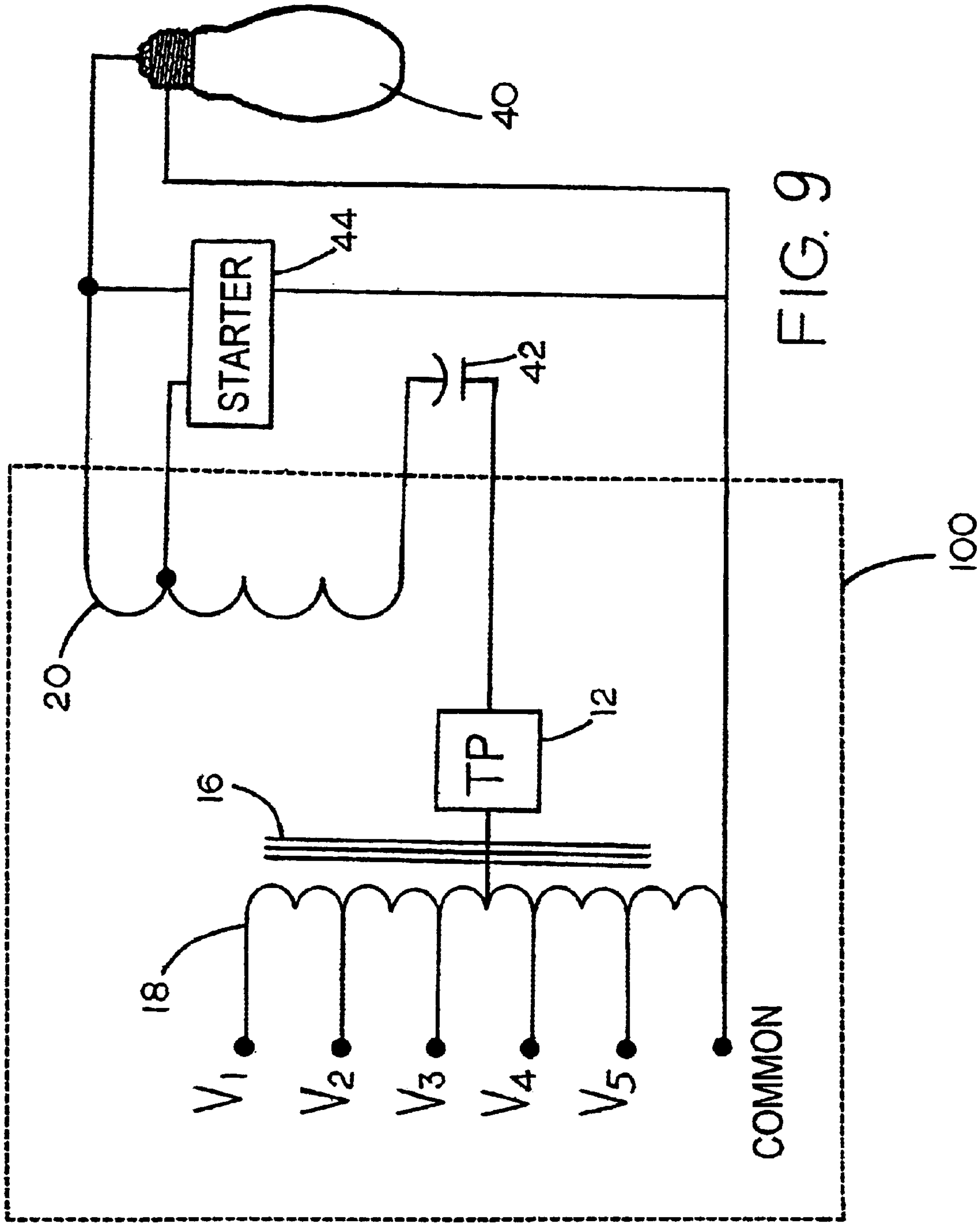
FIG. 9 is an electrical schematic of an improved thermally-protected ballast in accordance with this invention, shown as a component in a lighting circuit.

Ballast 14 is of the type having ballast laminations 16 and primary and secondary coils 18 and 20, respectively. Ballast bolts 22 extend through laminations 16 and assist in holding them together. One of such ballast bolts and its associated nut and lock washer serve to secure bracket 10 to ballast 14. Ballast 14 has a contact surface 14*a* (for contact with thermal protector 12) and an adjacent surface 14*b*, as shown best in FIGS. 1 and 8. FIGS. 7 and 8 illustrate bracket 10 and thermal protector 12 mechanically assembled with ballast 14, but with thermal protector wires 24 unconnected. FIG. 9 shows schematically the electrical connection of thermal protector 12 to secondary coils 18, as included in improved thermally-protected ballast 100, and illustrates a lighting circuit including improved ballast 100.

FIGS. 1–8 illustrate details of unitary bracket 10 and its relationship with respect to ballast 14. Unitary bracket 10 is formed of spring steel cut and bent into the desired shape, creating its various portions which will now be described. Bracket 10 includes: a holding-face portion 26, which is an unbroken planar wall that has opposite edges 26*a* and 26*b*, a mounting end 26*c* and an entry end 26*d* (see FIG. 4); first and second edge portions 28 and 30 on opposite edges 26*a* and 26*b*, respectively, of holding-face portion 26 and angled with respect to holding-face portion 26 toward ballast 14; a mounting-end portion 32 on mounting end 26*c* of holding-face portion 26 and extending toward ballast 14; and a finger-tab portion 34 on entry end 26*d* of holding-face portion 26.

Mounting-end portion 32 includes a spacing portion 32*s* which is contiguous with holding-face portion 26 and a mounting tab 32*t* which is contiguous with spacing portion 32*s* and is positioned for engagement with contact surface 14*a* of ballast 14. Bracket 10 is attached to ballast 14 by one ballast bolt 22, which firmly secures mounting tab 32*t* against contact surface 14*a*. Both mounting tab 32*t* and spacer portion 32*s* have free opposite edges, and this allows the remainder of bracket 10 to pivot slightly about mounting tab 32*t*, taking advantage of the spring qualities of the spring steel material of which bracket 10 is made. Finger-tab portion 34 extends part way toward contact surface 14*a* of ballast 14, and presents a smooth grip surface 34*a* for finger displacement of bracket 10 and for contact with wires 24 of thermal protector 12.

Thermal protector 12 has a main body 12*b* which includes a contact side 12*c* (see FIG. 8) for engagement with contact surface 14*a* of ballast 14 and a thickness dimension T (see FIG. 8) extending from contact side 12*c* to the side in contact with ballast 14. Mounting-end portion 32, particularly its spacing portion 32*s*, is configured and dimensioned such that, with thermal protector 12 removed, holding-face portion 26 is positioned no farther from contact surface 14*a* of ballast 14 than thickness T of thermal protector 12.

Indeed, with thermal protector 12 removed from bracket 10, holding-face portion 26 is in fact positioned slightly closer to contact surface 14*a* of ballast 14 than thickness T. When thermal protector 12 is in place, it is sandwiched against ballast 14 by bracket 10, acting through its holding-face portion 26. The various portions of bracket 10 are configured and dimensioned to provide such sandwiching of thermal protector 12 against ballast 14.

First and second edge portions 28 and 30 of unitary bracket 10 are parallel to one another; they are in substantially parallel planes. First edge portion 28 is wider than second edge portion 30; i.e., first edge portion 28 extends from holding-face portion 26 to a distal edge 28*e* which is spaced farther from holding-face portion 26 than thickness dimension T of thermal protector 12. As shown best in FIG. 8, first edge portion 28 extends far enough that it is in position to engage adjacent surface 14*b* of ballast 14, and in this way to serve an alignment function to properly position thermal protector 12 on contact surface 14*a* of ballast 14. Indeed, bracket 10 is configured such that the tightening of ballast bolt 22 on mounting tab 32*t* during assembly tends to rotate bracket 10 until first edge portion 28 engages adjacent surface 14*b*, where it stays as tightening of ballast bolt 22 is completed.

First and second edge portions 28 and 30 and holding-face portion 26 of unitary bracket 10 form an opening 36 (see arrow in FIG. 1) for insertion of thermal protector 12 and from which its wires 24 extend. Insertion of thermal protector 12 during assembly and any later replacement thereof are carried out easily and accurately by simply flexing the non-attached end of bracket 10, i.e., the end where finger-tab portion 34 is located, slightly away from ballast 14—enough to allow insertion. Bracket 10 also includes a retention spur 38 (see FIGS. 2–4), which is bent inwardly from holding-face portion 26 in a position near opening 36 which is beyond the end of main body 12*b* (of thermal protector 12) from which wires 24 project. Retention spur 38 projects from holding-face portion 26 in position to engage main body 12*b* of thermal protector 12 in order to prevent unintended withdrawal of thermal protector 12.

FIG. 9 shows the wiring of improved ballast 100 with thermal protection, as part of a circuit for operating metal halide lamp 40. The lighting circuit, in addition to improved ballast 100, includes a capacitor 42 and a starter 44. As can be seen, thermal protector 12 is wired in series with the secondary coil 20 of ballast 14, and is placed in direct contact ballast 14 by means of the inventive bracket described above. As indicated above, wiring assembly of thermal protector 12 with ballast 14 is independent of the input voltage to the primary coil required by the particular lamp 40 in connection with which improved ballast 100 is used, and mechanical assembly is carried quickly and easily at the time of manufacture.

In this example, lamp 40 is an M132 ANSI Code 320W metal halide lamp, and capacitor 42, starter 44, and ballast 14 from which improved ballast 100 is made all are specified in accordance with the M132 ANSI Code 320 rating of the lamp. Thermal protector 12 of improved ballast 100 is a Texas Instruments Series 7AM thermal protector designed to open at a temperature of 150° C. with a current rating in accordance with the lamp specified above, such thermal protector being placed in series with the secondary coil of the ballast. Thermal protector 12 as used in the preferred embodiment includes, on its outside, an electrically-insulating Mylar sleeve.

Appropriate materials and parts for the devices of this invention will be apparent to those who are skilled in the art and are made aware of this invention. Also, a great many substantial variations are possible in the configurations of unitary brackets designed to include the characteristics and requirements of this invention; variations in size, shapes and materials for the inventive bracket are possible. Likewise, substantial variations are possible in ballasts with thermal protection which include the inventive characteristics described and claimed herein.

While the principles of the invention have been shown and described in connection with specific embodiments, it is to be understood that such embodiments are by way of example and are not limiting.

What is claimed is:

1. A unitary bracket for mounting a thermal protector to an electrical device, comprising:

a holding-face portion having therealong opposite edges and a mounting end;

edge portions on the opposite edges of the holding-face portion and angled with respect thereto toward the electrical device; and a mounting-end portion on the mounting end and extending toward the electrical device, the mounting-end portion having a mounting tab for engagement with the electrical device, the mounting-end portion, the edge portions and the holding-face portion being configured and dimensioned such that the holding-face portion is supported in spaced relationship with respect to the electrical device to sandwich the thermal protector in direct contact with the electrical device when the mounting-end portion is secured thereto.

2. The unitary bracket of claim 1 wherein:

the thermal protector has a contact side for contact with a contact surface of the electrical device and a thickness; and the mounting-end portion is configured and dimensioned such that, with the thermal protector removed, the holding-face portion is positioned no farther from the contact surface of the electrical device than the thickness of the thermal protector.

3. The unitary bracket of claim 2 wherein, with the thermal protector removed, the holding-face portion is positioned slightly closer to the contact surface of the electrical device than the thickness of the thermal protector.

4. The unitary bracket of claim 3 wherein the bracket is of a springy material.

5. The unitary bracket of claim 4 wherein the bracket is of a springy metal.

6. The unitary bracket of claim 1 wherein the edge portions and the holding-face portion form an opening for insertion of the thermal protector and from which wires of the thermal protector extend, thereby facilitating assembly and replacement.

7. The unitary bracket of claim 6 further including a finger-tab portion on the holding-face portion at the insertion opening, the finger-tab portion extending part way toward the electrical device and having a smooth surface facing the electrical device for finger and wire contact.

8. The unitary bracket of claim 7 further including a retention spur projecting from the holding-face portion near the insertion opening in position to prevent unintended withdrawal of the thermal protector.

9. The unitary bracket of claim 1 wherein:

the thermal protector has a contact side for contact with a contact surface of the electrical device and a thickness;

the electrical device has an adjacent surface adjacent to the contact surface;

the edge portions of the unitary bracket are parallel; and one of the edge portions extends from the holding-face portion to a distal edge farther therefrom than the thickness of the thermal protector, whereby the one edge portion serves an alignment function to properly position the thermal protector on the contact surface of the electrical device.

10. The unitary bracket of claim 9 wherein the bracket is of a springy metal.

11. In a ballast for electrical lighting fixtures, the ballast being of the type having thermal protection, the ballast having ballast laminations and primary and secondary coils, a thermal protector and a mounting device for securing the thermal protector, the improvement comprising:

the thermal protector having a contact side for contact with a contact surface of the ballast;

the mounting device is a unitary bracket which includes:

a holding-face portion having therealong opposite edges and a mounting end;

edge portions on the opposite edges of the holding-face portion and angled with respect thereto toward the ballast; and a mounting-end portion on the mounting end and extending toward and secured to the ballast, the mounting-end portion having a mounting tab for engagement with the ballast, the mounting-end portion, the edge portions and the holding-face portion being configured and dimensioned to hold the thermal protector with its contact side against the contact surface of the ballast.

12. The ballast of claim 11 wherein:

the thermal protector has a thickness; and the mounting-end portion is configured and dimensioned such that the holding-face portion, with the thermal protector removed, is positioned no farther from the contact surface of the ballast than the thickness of the thermal protector.

13. The ballast of claim 12 wherein, with the thermal protector removed, the holding-face portion is positioned slightly closer to the contact surface of the ballast than the thickness of the thermal protector.

14. The ballast of claim 13 wherein the unitary bracket is of a springy material.

15. The ballast of claim 14 wherein the unitary bracket is of a springy metal.

16. The ballast of claim 11 wherein the thermal protector is wired in series with the secondary coil, whereby wiring assembly of the thermal protector with the ballast is independent of an input voltage to the primary coil of the ballast.

17. The ballast of claim 11 wherein the mounting tab has a hole therethrough and is secured to the ballast with a fastener.

18. The ballast of claim 17 wherein:

the ballast is of the type having its laminations held together by at least one ballast bolt therethrough; and the fastener is one of the ballast bolts.

19. The ballast of claim 11 wherein the edge portions and the holding-face portion form an opening for insertion of the thermal protector and from which wires of the thermal protector extend, thereby facilitating assembly and replacement.

20. The ballast of claim 19 further including a finger-tab portion on the holding-face portion at the insertion opening, the finger-tab portion extending part way toward the contact surface of the ballast and having a smooth surface facing the ballast for finger and wire contact.

21. The ballast of claim 20 further including a retention spur projecting from the holding-face portion near the insertion opening in position to prevent unintended withdrawal of the thermal protector.

22. The ballast of claim 11 wherein:

the thermal protector has a contact side for contact with a contact surface of the ballast and a thickness;

the ballast has an adjacent surface adjacent to the contact surface;

the edge portions of the unitary bracket are parallel; and one of the edge portions extends from the holding-face portion to a distal edge farther therefrom than the thickness of the thermal protector, whereby the one edge portion serves an alignment function to properly position the thermal protector on the contact surface of the ballast.

23. The ballast of claim 22 wherein the unitary bracket is of a springy metal.

24. In a ballast for electrical lighting fixtures, the ballast being of the type having thermal protection, the ballast having ballast laminations and primary and secondary coils, a thermal protector and a mounting device for securing the thermal protector, the improvement comprising:

the ballast being of the type having its laminations held together by at least one ballast bolt therethrough; and the mounting device is a unitary bracket which includes:

a holding-face portion having a mounting end;

a mounting-end portion on the mounting end and extending toward the ballast, the mounting-end portion having a mounting tab for engagement with the ballast, the mounting-end portion and the holding-face portion being configured and dimensioned such that the holding-face portion is supported in spaced relationship with respect to the ballast to hold the thermal protector against the ballast; and the mounting tab having a hole therethrough receiving one of the ballast bolts, thereby securing the mounting tab to the ballast.

25. The ballast of claim 24 wherein the unitary bracket includes edge portions extending therefrom positioned with respect to the holding-face portion to hold the thermal protector in place.

26. The ballast of claim 25 wherein the edge portions and the holding-face portion form an opening for insertion of the thermal protector and from which wires of the thermal protector extend, thereby facilitating assembly and replacement.

27. The ballast of claim 26 further including a finger-tab portion on the holding-face portion at the insertion opening, the finger-tab portion extending part way toward the contact surface of the ballast and having a smooth surface facing the ballast for finger and wire contact.

28. The ballast of claim 27 further including a retention spur projecting from the holding-face portion near the insertion opening in position to prevent unintended withdrawal of the thermal protector.

29. The ballast of claim 24 wherein:

the thermal protector has a thickness; and the mounting-end portion is configured and dimensioned such that the holding-face portion, with the thermal protector removed, is positioned no farther from the contact surface of the ballast than the thickness of the thermal protector.

30. The ballast of claim 29 wherein, with the thermal protector removed, the holding-face portion is positioned slightly closer to the contact surface of the ballast than the thickness of the thermal protector.

31. The ballast of claim 30 wherein the unitary bracket is of a springy material.

* * * * *